United States Patent [19]
Matzen, Jr.

[11] Patent Number: 4,658,282
[45] Date of Patent: Apr. 14, 1987

[54] SEMICONDUCTOR APPARATUS

[75] Inventor: Walter T. Matzen, Jr., Richardson, Tex.

[73] Assignee: Honeywell Inc., Minneapolis, Minn.

[21] Appl. No.: 625,483

[22] Filed: Jun. 28, 1984

[51] Int. Cl.⁴ ................. H01L 29/72; H01L 29/34
[52] U.S. Cl. .......................... 357/34; 357/54; 357/38; 357/52
[58] Field of Search ............... 357/34, 54, 38, 52

[56] References Cited
U.S. PATENT DOCUMENTS 4,400,716  8/1983  Tani et al. .................. 357/54
4,485,393  11/1984  Kamamaru et al. .......... 357/34

Primary Examiner—Martin H. Edlow
Assistant Examiner—Terri M. Henn
Attorney, Agent, or Firm—Theodore F. Neils; Trevor B. Joike

[57] ABSTRACT

A semiconductor junction related structure to control sensitivity of signal processing systems to signals of greater versus smaller values.

9 Claims, 8 Drawing Figures

SEMICONDUCTOR APPARATUS

BACKGROUND OF THE INVENTION

This invention relates to insulating structures in connection with semiconductor junctions, and more particularly, with semiconductor junctions involved in photodetection systems.

Desirably, a photodetection system responding to signals from a photodetector, such as a photodiode, should sense those signals from the photodetector occuring within a selected signal magnitude range, yet be insensitive to detector signals in a smaller magnitude range not representing that which is to be sensed. For sufficiently small values of these smaller magnitude signals in a photodiode, they will at some point be dominated by signal contributions, here signals currents, arising both from unwanted background radiation falling upon the photodetector, and from "dark currents" arising from thermal generation of electron-hole pairs in the depletion or space-charge region of the photodiode. A photodetection system for receiving such photodetector signals should enhance the system response to desired optical signals versus unwanted signals, such as dark currents, by decreasing the system sensitivity at low input signal levels.

SUMMARY OF THE INVENTION

The invention provides a photodetection structure having a semiconductor junction which provides some control over the response of the photodetection structure to signals from the photodetector, the point at which this control begins to reduce system response to lower signal values being determined by the amount of surface current flowing across such junction in a surface intersecting this junction relative to currents flowing in the semiconductor bulk across this junction. The amount of this surface current is determined by the proportion of the junction-surface intersection which is covered by a passivating insulating layer versus the amount which is covered by another insulating layer permitting higher surface currents to flow. Such a junction may be present, for instance, in a bipolar transistor or silicon controlled rectifier to which the photodiode is connected.

DESCRIPTION OF THE PREFERRED EMBODIMENTS

There are several commonly used photodetection signal processing system input arrangements in use. The photodetector being used to supply input signals to these input arrangements may be provided as part of the monolithic integrated circuit of which the input arrangement is also a part. Very often, the photodetector is provided as a photodiode which is formed from a semiconductor pn junction occuring in the first component device monolithic integrated structure of the input arrangement.

In these circumstances the first component device in the input arrangement may be simply a bipolar transistor having its base-collector junction exposed to the incoming electromagnetic radiation to be sensed to form a phototransistor or to form part of a photo-Darlington structure. Alternatively, the arrangement may be part of a more complex structure such as a photo-silicon controlled rectifier. Of course, a separate photodiode structure can be made in a monolithic integrated circuit and electrically connected in parallel across the semiconductor pn junction of an input arrangement component device if that is desirable.

In either event, an equivalent circuit for analysis purposes can be established using separate component devices connected together for the photodetector and the first component device or devices in the photodetection signal processing system input arrangement. Thus, for instance, there is shown in FIGS. 1 and 2 a low-frequency equivalent circuit for a phototransistor and a photo-Darlington structure, respectively.

Figure 1:
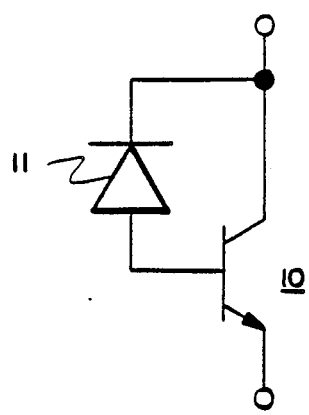
FIG. 1 is a schematic diagram of a photodetector-initial photodetection signal processing circuit combination, or the equivalent circuit of a phototransistor.
Figure 2:
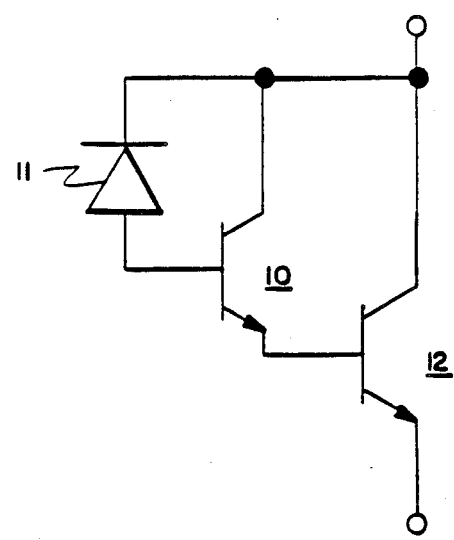
FIG. 2 is a schematic diagram of an alternative photodetector-initial photodetection signal processing circuit combination, or the equivalent circuit of a photo-Darlington structure.

The equivalent circuit diagram of FIG. 1 (or the actual circuit diagram in the case of separate component devices) permits considering a typical situation in which a photodetector is electrically connected to the initial component device of a photodetection signal processing system input arrangement. In this circuit, a bipolar npn transistor, 10, has a photodiode, 11, electrically interconnected between the collector of transistor 10 and the base thereof. The anode of diode 11 is connected to the base of transistor 10 and the cathode diode 11 is connected to the collector of transistor 10.

The common emitter current gain, $h_{FE}=I_C/I_B$, of a silicon transistor decreases as the collector current through that transistor is decreased. This can be seen in FIG. 3 which is a graph of the common emitter current gain for an npn silicon transistor versus collector current in milliamps. The solid line is the actual graph while the dashed line shows a breakpoint construction.

Figure 3:
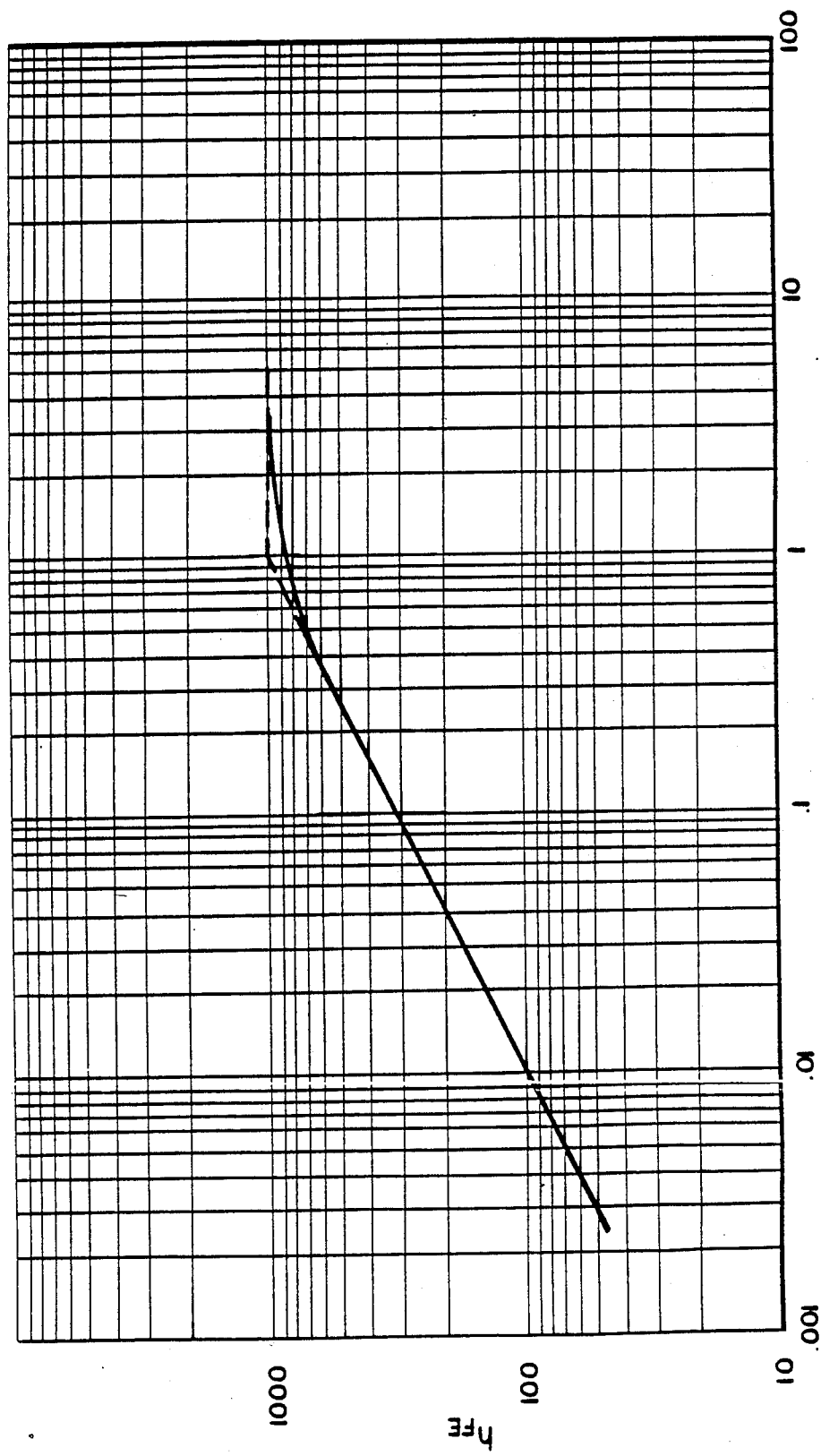
FIG. 3 is a graph of a transistor characteristic where the transistor has embodied therein the present invention.

The characteristic displayed in FIG. 3 follows from the nature of the currents in the transistor of FIG. 1. As is well known, the collector current $I_C$ can be approximated as the diffusion current crossing the collector junction which can be represented as follows:

$$I_C = I_S e^{(qV_{BE}/kT)}.$$

Here, $I_s$ is a proportionality factor called the saturation current for the transistor and depends on certain geometrical and material characteristics. The other parameters are q which is the electronic charge value, k which is Boltzmann's constant, and T which is the absolute temperature. The other variable, $V_{BE}$, is the voltage across the base-emitter junction which controls the diffusion current collected across the collector-base junction.

The base current for the npn transistor of FIG. 1 can be approximated by the following equation:

$$I_B = I_{BD} + I_{SC},$$

where the first term on the right represents a diffusion current associated with the base-emitter junction which can be expressed for present purposes as the following:

$$I_{BD} = \left(\frac{I_S}{h_{FEi}}\right) e^{\frac{qV_{BE}}{kT}}.$$

Here, $h_{FEi}$ is the common emitter current gain for a transistor having as current flows only the primary diffusion currents, ie. an idealized transistor.

The second term on the right hand side of the equation for the base current above represents some of the currents present in a non-idealized transistor, and here will be termed the space-charge region current. These currents arise from electron-hole recombination in the space-charge region at the base-emitter junction, both recombination in the device bulk semiconductor and at the device surface where the junction intersects the surface. Because of the nature of the semiconductor material surface and the intersection of a semiconductor junction in such a surface, substantial surface recombination currents, ie. surface space-charge currents, can flow in the absence of a sufficient passivating layer reducing the number of surface states available supporting such surface currents.

For present purposes, the space-charge current can be approximated by the following:

$$I_{SC} = I_x e^{(qV_{BE}/nkT)},$$

where $I_x$ is a proportionality constant which depends on characteristics of the geometry and the materials involved and include a dependence both on the length of the intersection of the base-emitter junction in the surface and the quality of passivation over the surface space-charge zone along this intersection, and where n is a constant between 1 and 2, usually near 2 for silicon, and will be assumed to be 2 herein.

Figure 4:
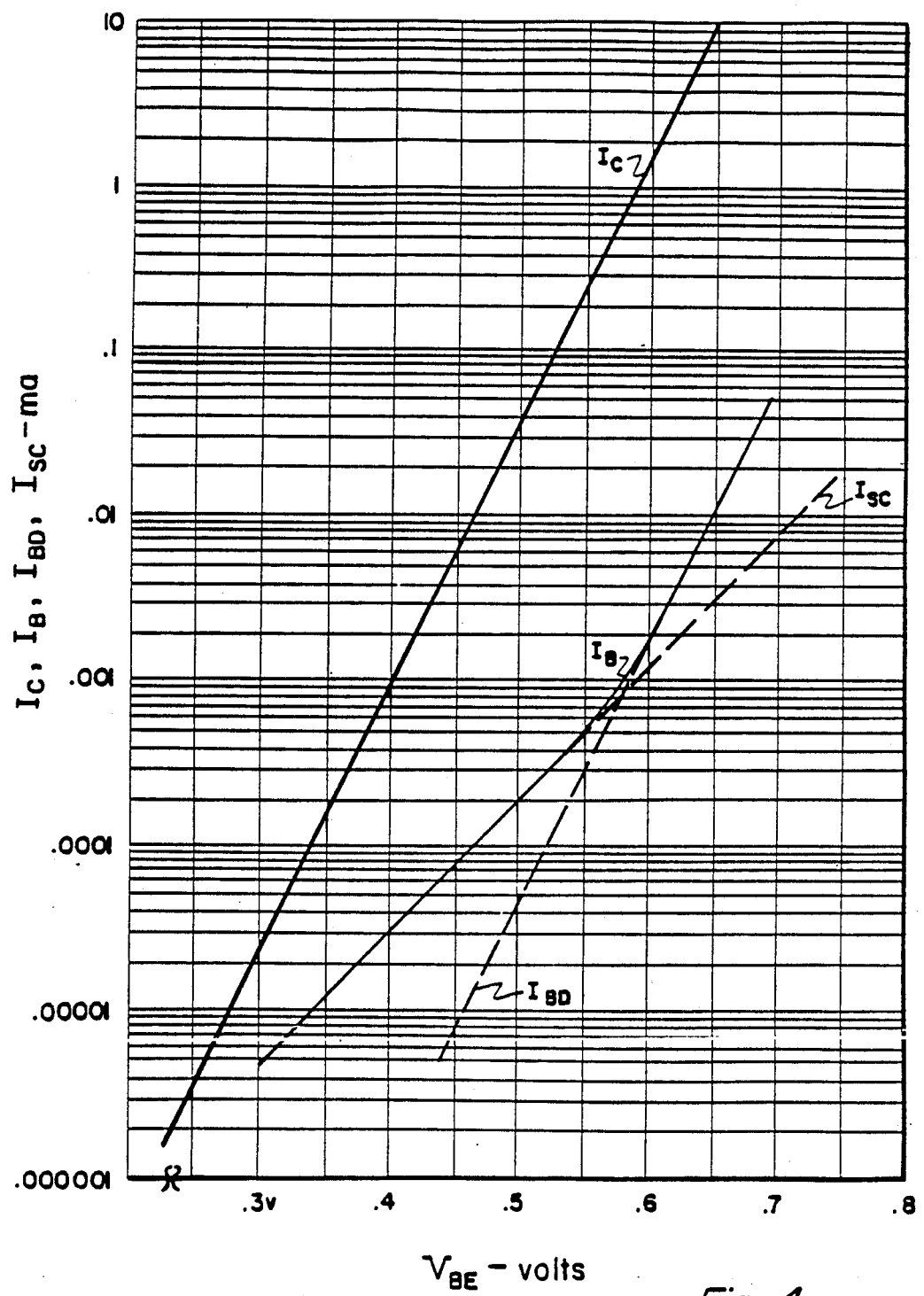
FIG. 4 is a graph of alternative transistor characteristics of the transistor of FIG. 3.

The currents expressed above are shown in the graphs of FIG. 4. From these graphs the explanation for the falloff and the common emitter transistor gain $h_{FE}$ ($h_{FE} = I_C/I_B$) with collector current $I_C$ flowing in the transistor can be explained. Though the curve for $I_C$ is shown as a straight light in FIG. 4, the curve for $I_B$ is shown to asymptotically meet two straight line curves in FIG. 4, one for $I_{SC}$ and the other $I_{BD}$. As can be seen, at lower values of $I_B$, the space-charge current begins to dominate the diffusion current causing the breakpoint to occur in $I_B$ and so in the graph of $h_{FE}$ shown in FIG. 3.

By raising or lowering the line representing $I_{SC}$ in FIG. 4, the breakpoint in $h_{FE}$ can be made to occur at greater or lesser values of collector current $I_C$. That is, by increasing or decreasing the space-charge current which flows at any given base-emitter voltage, the breakpoint in the graph of $h_{FE}$ can be made to occur at a higher or lower collector current in the transistor. Note that the breakpoint shown in FIG. 3 occurs at around 1 ma, a point which is well above the usual breakpoint for $h_{FE}$ versus collector current for a silicon transistor, in fact, above by some orders of magnitude. This breakpoint occuring at a higher value of collector current can be accomplished by increasing the space charge current through changing the passivation occuring around the base-emitter junction in a manner which will be described below.

In many, perhaps most, applications of bipolar transistors, there is a desire to keep the common emitter current gain $h_{FE}$ as high as possible down to very low collector current, and so such an increase in breakpoint with $I_C$ as shown in FIG. 3 is generally undesirable. However, the breakpoint shifting capability indicated above can be used to significant advantage in a component device in the input arrangement of a photodetection signal processing system connected to a photodetector. This capability to reduce the gain of such a component device, and so of the input arrangement, at lower collector currents, or equivalently, at lower base currents which are low enough to approach the values of currents supplied as dark currents by the photodetector connected to the component device means the system gain for such dark currents will be reduced.

The ability to move the breakpoint, ie. the falloff point of the common emitter current gain, to higher values of base current means that the input arrangement component device in the photodetection signal processing system can be made to exhibit relatively low gain to as high a value as desired of dark current provided by the photodetector connected to such device. Hence, the input arrangement component device can be adjusted to accommodate different kinds of photodetectors or different conditions for any particular photodetector.

For instance, since dark currents increase with temperature because they depend on thermal generation of electron-hole pairs, systems using such photodetectors which are to be operated at higher temperatures will have higher value dark currents. Such a system can use an input arrangement component device having its breakpoint set at a sufficiently higher value to accomodate the higher base current which will be supplied as dark current from the photodetector so that a relatively low gain is applied to such dark current.

Figure 5A:
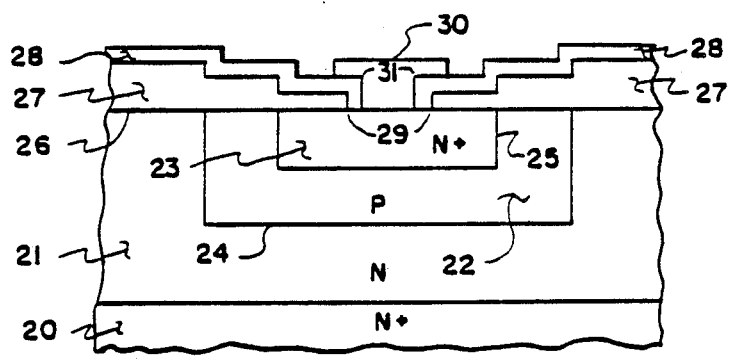
FIGS. 5A, B and C show a bipolar transistor structure illustrating the presence and absence of the present invention.

A construction for a bipolar transistor in a monolithic integrated structure implementation is shown in a cross section view in FIG. 5A. Only a small portion of the monolithic integrated structure is shown which contains the bipolar transistor with remaining portions of the structure not being shown, such as the substrate and component device isolation means, if the structure is part of a monolithic integrated circuit. A portion of an n+-type conductivity substrate (or if an integrated circuit, buried layer), 20, is shown which is diffused during epitaxial deposition into an n-type epitaxial layer, 21. A p-type conductivity base region, 22, has been formed in epitaxial layer 21, and an n+-type conductivity emitter, 23, has been formed in this base region. Base region 22 is separated from epitaxial layer 21 and substrate (or buried layer region) 20 (where 21 and 20 together form the collector for the transistor) by a semiconductor pn junction, 24, the collector-base junction. Emitter region 23 is separated from base region 22 by another semiconductor pn junction, 25, the base-emitter junction.

A major surface, 26, of the epitaxial layer 21 which is intersected by base region 22 and emitter region 23, as well as by the semiconductor pn junctions 24 and 25, has disposed upon it electrical insulating layers and a portion of an electrical interconnection arrangement. A silicon dioxide layer, 27, is shown disposed on most of surface 26 in FIG. 5A. A silicon nitride layer, 28, is disposed on silicon dioxide layer 27 except where it reaches layer 26 in an opening, 29, through layer 27 to permit the forming of a metallization interconnection portion, 30, for electrically contacting emitter region 23. An opening, 31, is provided through layer 28 to permit interconnection portion 30 to reach emitter region 23. No metallization interconnection portions for electrically connecting either base region 22 or the collector comprising portions 20 and 21 in FIG. 5A are shown in that Figure.

A plan view of a portion of the same transistor shown in FIG. 5A is set out in FIG. 5B in the situation where the transistor of FIG. 5A is to be an ordinary transistor having a low collector current value breakpoint below which falloff occurs for the transistor common emitter gain $h_{FE}$. The portions of FIG. 5B which are the same as those in FIG. 5A are designated with the same numerals in each figure. No special use of dashed lines is made in FIG. 5B to show or indicate which portions would be hidden by structures over them in this view. Note again that neither the base electrical interconnection nor the collector electrical interconnection is shown.

Figure 5B:
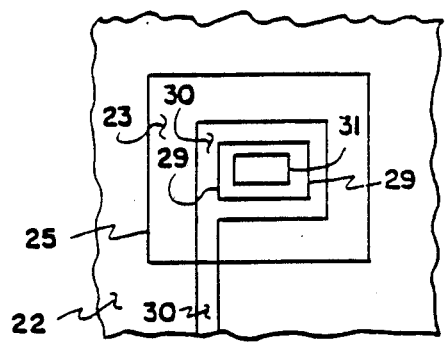

Opening 29 in silicon dioxide layer 27 is shown in FIG. 5B to occur entirely within emitter region 23. The result is that silicon dioxide layer 27 covers the intersection of base-emitter junction 25 with major surface 26 at all locations along this intersection. Silicon dioxide, in addition to being an electrical insulating layer, is a very fine passivating layer and very useful in reducing the surface traps which permit surface current to flow across junction 25 and the space-charge zone thereabout in the presence of a voltage difference being maintained between emitter region 23 and base region 22.

As a result of this structure, relatively little space-charge region current will flow from one side of junction 25 to the other at major surface 26, so that $I_{SC}$ is relatively small and the breakpoint in $h_{FE}$ will occur at a relatively low value of collector current. Here then, silicon nitride layer 28 over silicon dioxide layer 27 primarily performs the functions of keeping certain contaminates from reaching silicon dioxide layer 27 and so affecting the semiconductor material therebelow, and providing certain optical benefits in the situation where semiconductor pn junction 24 is exposed to electromagnetic radiation in serving as a photodiode as well as serving as the collector-base junction.

Figure 5C:
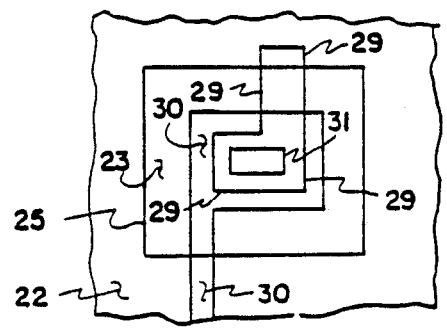

FIG. 5C is another plan view of the transistor in FIG. 5A but where that transistor has been structured in such a manner as to move the breakpoint in common emitter current gain $h_{FE}$ to occur at a higher value of collector current. Again, regions in FIG. 5C corresponding to those in FIG. 5A are designated in the same manner, and no special lines are used to show which structures would be hidden by structures above them in FIG. 5C. There is no showing in FIG. 5C either of junction 24 which, as earlier indicated, may be exposed to incoming electromagnetic radiation to serve as a photodiode in addition to serving as the collector-base junction. To provide for such a photodiode would require no more than providing the proper thickness at layers 28 and 27 over junction 24 to pass light while serving as an antireflective layer and as a passivating layer. No base or collector interconnections are shown in FIG. 5C.

In FIG. 5C, as opposed to FIG. 5B, opening 29 in oxide layer 27 extends over the intersection of base-emitter junction 25 in major surface 26 to permit silicon nitride layer 28 to be disposed on major surface 26 over the space-charge zone for a selected length of that intersection, leaving the zone along the remaining length of that intersection under silicon dioxide layer 27. Silicon nitride does not have nearly the ability that silicon dioxide has to passivate silicon surfaces at the intersection of such surfaces with semiconductor pn junctions. As a result, silicon nitride on major surface 26 will permit relatively larger surface currents to flow thereunder from one side of junction 25 to the other across the space charge region occuring at junction 25 if region 23 and region 22 have a voltage potential maintained between them.

Thus, by selecting the fraction of the intersection zone of junction 25 in surface 26 which is covered by silicon nitride versus the portion which is covered by silicon dioxide the amount of surface current flowing across junction 25 in the presence of a voltage potential difference maintained on either side thereof can to a significant degree also be selected. Since this is part of a space-charge current, an increase in the proportion of the intersection covered by silicon nitride will effectively move the line designated $I_{SC}$ in FIG. 4 upward to thereby permit selecting the breakpoint at which the common emitter current gain $h_{FE}$ begins to fall off in FIG. 3 for values of collector current therebelow.

Figure 6:
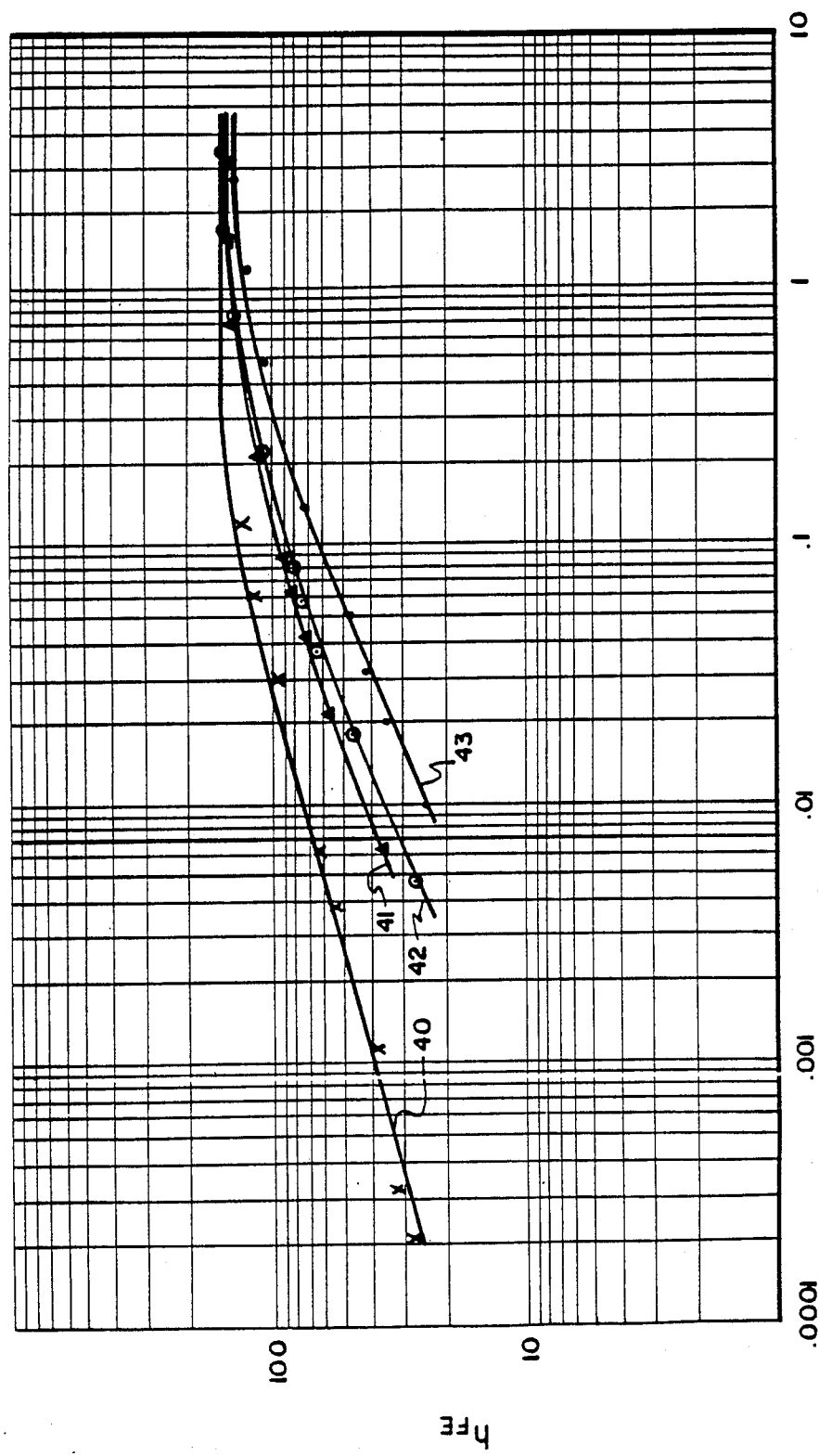
FIG. 6 is a graph of transistor characteristics comparing transistors which do and do not have the present invention embodied therein.

FIG. 6 shows the results of having four to five percent of the base-emitter junction covered with silicon nitride with the remaining portions thereof covered with silicon dioxide. The graphs in FIG. 6 are taken from a photodetection signal processing system input arrangement like that shown in FIG. 2, a photo-Darlington circuit at the beginning of such an input arrangement. Transistor 10 in FIG. 2 and photodiode 11 in FIG. 2 correspond to those shown in FIG. 1, but the emitter of FIG. 1 is connected to the base of a further npn bipolar transistor, 12. The graphs in FIG. 6 are of the common emitter current gain $h_{FE}$ of transistor 10 versus the collector current $I_C$ of transistor 10 connected in the arrangement shown in FIG. 2. Graph 40 represents a transistor having silicon dioxide passivating an entire semiconductor surface at the intersection of the base-emitter junction. Graphs 41, 42 and 43 represent transistors where silicon nitride covers four to five percent, as previously indicated, of the base-emitter junction length. The falloff in $h_{FE}$ clearly begins at higher collector currents for graphs 41 through 43 than it does for graph 40.

The embodiments of the invention in which an exclusive property or right is claimed are defined as follows:

1. A semiconductor device having a first semiconductor junction therein intersecting a surface at which a selected surface current can flow from one side of said first semiconductor junction to another, said device comprising:

a semiconductor material body of a first conductivity type at least in a first portion thereof forming a first body portion, but being other than of said first conductivity type in at least one selected region in said first body portion including a first selected region which is of a second conductivity type, said first semiconductor junction separating said first selected region from that part remaining of said first body portion, and said semiconductor material body having a first major surface with (i) said first body portion intersecting said major surface to form a first major surface portion, and (ii) with said first selected region also intersecting said first major surface to form a first selected region surface portion contained in said first major surface portion, such that said first selected region surface portion is separated from that part remaining of said first major surface portion by said first semiconductor junction where said first semiconductor junction intersects said first major surface to thereby form a first semiconductor junction surface intersection peripheral to said first selected region where said first selected region intersects said first major surface; and first and second electrical insulating layers disposed at least in part on said semiconductor material body at said first major surface portion in such a manner that said first electrically insulating layer is directly on and covers a selected portion of said first semiconductor junction surface intersection and said second electrical insulating layer is directly on and substantially covers at least some of those portions remaining of said first semiconductor junction surface intersection, said second electrical insulating layer being a passivating layer which leads to reduced surface current flowing across portions of said first semiconductor junction surface intersection thereunder relative to surface currents flowing across portions of said first semiconductor junction surface intersection under said first electrical insulating layer if a voltage potential difference is maintained between said first selected region and those portions of said first body portion immediately across said first semiconductor junction surface intersection from said first selected region.

2. The device of claim 1 wherein said semiconductor body is primarily of silicon, said first electrical insulating layer is primarily a nitride of silicon, and said second electrical insulating layer is primarily an oxide of silicon.

3. The device of claim 1 wherein portions of said first electrical insulating layer are disposed on said second electrical insulating layer opposite at least some locations where portions of said second electrical insulating layer are disposed on said first major surface at said first semiconductor junction surface intersection.

4. The device of claim 1 wherein a second semiconductor junction is provided separating said first body portion from remaining portions of said semiconductor body where those remaining portions of said semiconductor body adjacent said second semiconductor junction are of a said second conductivity type and where said second semiconductor junction surrounds said first major surface portion in said first major surface.

5. The device of claim 3 wherein said semiconductor body is primarily of silicon, said first electrical insulating layer is primarily a nitride of silicon, and said second electrical insulating layer is primarily an oxide of silicon.

6. The device of claim 4 wherein a photodiode is provided electrically connected between those portions of said remaining semiconductor body portions adjacent said second semiconductor junction and said first body portion.

7. The device of claim 4 wherein such device is a bipolar transistor.

8. The device of claim 4 wherein such device is a silicon controlled rectifier.

9. The device of claim 6 wherein said second semiconductor junction serves as said photodiode.

* * * * *